United States Patent
Li et al.

(10) Patent No.: US 12,062,907 B2
(45) Date of Patent: Aug. 13, 2024

(54) METHOD FOR PROTECTING DC LINE IMPEDANCE PHASE BASED ON PROTECTION AND CONTROL COORDINATION

(71) Applicant: Beijing Jiaotong University, Beijing (CN)

(72) Inventors: Meng Li, Beijing (CN); Jinghan He, Beijing (CN); Keao Chen, Beijing (CN); Dahai Zhang, Beijing (CN); Pinghao Ni, Beijing (CN); Yin Xu, Beijing (CN); Xiaojun Wang, Beijing (CN); Guomin Luo, Beijing (CN); Xiangyu Wu, Beijing (CN); Fang Zhang, Beijing (CN)

(73) Assignee: Beijing Jiaotong University, Beijing (CN)

( * ) Notice: Subject to any disclaimer, the term of this patent is extended or adjusted under 35 U.S.C. 154(b) by 147 days.

(21) Appl. No.: 17/856,621

(22) Filed: Jul. 1, 2022

(65) Prior Publication Data

US 2023/0231377 A1    Jul. 20, 2023

(30) Foreign Application Priority Data

Jan. 19, 2022   (CN) .......................... 2022100649242

(51) Int. Cl.
*H02H 7/26* (2006.01)
*G01R 31/08* (2020.01)

(52) U.S. Cl.
CPC ........... *H02H 7/268* (2013.01); *G01R 31/086* (2013.01); *G01R 31/088* (2013.01)

(58) Field of Classification Search
CPC .... H02H 7/265; H02H 7/268; G01R 19/2513; G01R 31/11; G01R 31/086; G01R 31/088; Y02E 60/60

(Continued)

(56) References Cited

FOREIGN PATENT DOCUMENTS

| CN | 105098738 A | * | 11/2015 | |
| CN | 107064734 A | * | 8/2017 | ........... G01R 31/086 |

(Continued)

OTHER PUBLICATIONS

Machine translation of Gao et al. Chinese Patent Document CN 105098738 A Nov. 2015 (Year: 2015).*

(Continued)

*Primary Examiner* — Kevin J Comber (74) *Attorney, Agent, or Firm* — Emerson, Thomson & Bennett, LLC; Roger D. Emerson; Matt J. Wilson (57) ABSTRACT

The present disclosure relates to a method for protecting DC line impedance phase based on protection and control coordination, and an application scenario of the method for protecting is a three-terminal flexible DC transmission network. The method uses high controllability of a converter after a fault, injects a characteristic signal at a characteristic frequency, and calculates a phase angle of input impedance to determine a fault interval, which effectively improves protection performance, turns passive to active, and is not affected by nonlinearity of the converter. At the same time, compared with a full-bridge MMC, using a half-bridge MMC does not need to perform fault ride-through first when identifying a fault, and does not need to add additional equipment, it creates fault features and can reliably identify an fault interval; improves protection quickness and at the same time also has better economic benefits. It has selectivity, and an entire system may not be shut down due to failure of a single line.

2 Claims, 5 Drawing Sheets (58) Field of Classification Search
USPC .......................................................... 361/62
See application file for complete search history.

(56) References Cited

FOREIGN PATENT DOCUMENTS

| CN | 109085460 A | * | 12/2018 | ........... G01R 31/085 |
| CN | 109256756 A | * | 1/2019 | ............. H02H 3/066 |

OTHER PUBLICATIONS

Machine translation of He et al. Chinese Patent Document CN 107064734 A Aug. 2017 (Year: 2017).*
Machine translation of Chen et al. Chinese Patent Document CN 109085460 A Dec. 2018 (Year: 2018).*
Machine translation of Song et al. Chinese Patent Document CN 109256756 A Jan. 2019 (Year: 2019).*

* cited by examiner

METHOD FOR PROTECTING DC LINE IMPEDANCE PHASE BASED ON PROTECTION AND CONTROL COORDINATION

TECHNICAL FIELD

The present disclosure relates to a method for protecting DC line impedance phase based on protection and control coordination.

BACKGROUND

Nowadays, converters in flexible DC grids usually use half-bridge sub-modules or full-bridge sub-modules as basic units. Due to the large number of sub-modules, the nearest level approximation modulation technology is usually used, having the advantages such as active and reactive decoupling control, power flow reversal, no need for filtering, reactive power compensation equipment, and power supply to islands. In a power system, it provides an effective solution for the centralized and large-scale development and long-distance transmission of renewable energy, as well as for improving the flexibility and reliability of grid operation, which is maintaining a rapid development trend worldwide. However, a flexible DC system has very little damping, and power electronic equipment has weak ability to withstand overcurrent. When a fault occurs on the DC side, fault current rises rapidly. In order to ensure the safety of converter equipment, sub-modules often reduce the threat of fault current to the power electronic equipment through strategies such as blocking control or active current limiting. However, converter blocking control or active current-limiting control often leads to weakening of original fault features, at the same time, nonlinearity brought by the control process becomes an interference component in the protection. It is necessary to use an effective protection solution to ensure the effective identification of a fault interval, so that the system can quickly isolate the fault and resume normal operation. Therefore, the protection solution of the flexible DC grid is a key technology for the development of the power grid.

At present, in order to limit the fault current, there are roughly three solutions. The first is to install a larger current-limiting reactor on both sides of a line to suppress a rising rate of the fault current. However, this solution not only increases an input cost of the power grid, but also affects dynamic characteristics of the entire power grid. The second is to design a current-limiting strategy after converter failure. By bypassing a certain number of bridge arm sub-modules, the purpose of suppressing the fault current may be achieved. However, while introducing the nonlinearity, the original fault features are reduced and the sensitivity and reliability of the protection is affected, which may result in protection refusal. The third is to use the sub-module reverse input capability of a full-bridge MMC to prevent the sub-modules from continuing feeding current to a fault point. Although the fault current can be greatly limited, a fault transient process is extremely short, fault transient information available for the protection is extremely scarce, which affects protection performance.

Therefore, the existing technical solution converts the idea from the traditional passive use of fault transient information to construct protection and identification of faults, to the development of high controllability of the converter, and injects certain characteristic signals after a fault to effectively identify the fault interval. Some scholars propose to use the controllability of the full-bridge MMC to control the fault current to 1.2 times a rated current after the fault, and identify the fault interval through current zero-crossing characteristics at both ends of the line. Considering the high controllability of the converter, after full-bridge sub-modules completely suppress the fault current to zero, it may be input to the sub-modules according to a certain design rule. Corresponding voltage and current signals may be injected into a fault network, and then based on the idea of line pattern identification, it may be determined whether the line is faulty. Also, some scholars inject signal pulses and compare reflected wave head characteristics to determine whether the fault disappears. The above protection solution no longer relies on fault transient characteristics that are easy to disappear, or is affected by the nonlinear control of the converter. It uses the high controllability of the power electronic equipment to actively create fault features to assist in the realization of protection.

The existing protection solution has the following shortcomings: 1) The protection solution based on traveling wave is easily affected by transition resistance and noise interference, the sensitivity and reliability are affected, and it is affected by control nonlinearity; 2) The protection solution based on boundary transients needs to configure a current-limiting reactor on both sides of the line at the same time, and is affected by control nonlinearity of the converter; 3) The protection solution based on current differential is easily affected by distributed capacitance of the line, and quickness of the protection is affected; 4) The zero-crossing protection based on full-bridge MMC current-limiting control is only suitable for bipolar faults, and its ability to withstand the transition resistance is weak; and 5) The implementation of the protection solution based on full-bridge MMC active signal injection is after the fault rides through, and the quickness of the protection is affected.

SUMMARY

With the access of a higher proportion of distributed energy and the rapid development of high-power electronic new-type power systems, multi-terminal flexible DC grids have been widely used. Advantages of flexible DC transmission grids such as independent control of active and reactive power components and flexible access to the distributed energy have received extensive attention and in-depth scientific research in engineering. However, converter stations are often connected over a long distance through overhead lines, an occurrence of ground faults is high, and DC grid systems have little damping. After a fault, a plurality of power sources feed current to a fault point, and fault current may rise to a large value within a few milliseconds, which poses a great threat to the security of the entire DC grid. Therefore, a fast and reliable line protection solution is one of the key technologies to ensure the safe and stable operation of flexible DC grids.

For most of the existing protection solutions, the difference of transient characteristics after faults is passively explored, so as to realize the identification of a fault interval. In practical engineering, traveling wave protection and differential undervoltage protection have been widely used because of their simple algorithms and good protection quickness. However, factors such as noise interference and transition resistance may affect the sensitivity and reliability of the protection, greatly reducing the probability of the fault being effectively identified. With the configuration of current-limiting reactors on both sides of flexible DC grid lines, some scholars have proposed protection based on a construction boundary of the current-limiting reactor. First, a protection solution based on a rate of change of line side voltage of the current-limiting reactor is proposed, however, this protection solution is greatly affected by the transition resistance. In order to improve the ability to withstand the transition resistance, a protection solution based on a transient voltage ratio on both sides of the current-limiting reactor is further proposed, but it lacks theoretical basis when used as single-ended protection, and double-ended longitudinal protection needs to be formed to meet selectivity requirements. At the same time as the means of communication is used, the speed of the protection is also affected. The above protection solutions not only have these defects, but in the flexible DC grids with high-power electronics, converter control after fault causes the fault features to show strong nonlinearity, and the traditional passive protection solution based on fault transient components is further affected, greatly increasing the possibility of misoperation or refusal of operation of the protection.

In view of the above situation, the present disclosure proposes a method for protecting DC line impedance phase based on protection and control coordination. The method uses a converter to actively generate a characteristic signal after a fault, and by extracting a feature quantity injected at this frequency to identify interval and external faults, the method for protecting can solve the following problems: 1) Compared with the traditional passive protection solution, it no longer relies on short-term fault transient characteristics; 2) it actively uses the converter to generate characteristic signals to identify faults, turns passive into active, and greatly reduces the influence of converter nonlinearity; and 3) while generating the characteristic signals, it reduces the input number of sub-modules and the growth rate of fault current, which may protect power electronic elements.

In order to achieve the above purposes, the technical solution adopted in the present disclosure is:

A method for protecting DC line impedance phase based on protection and control coordination, an application scenario of the method for protecting is a three-terminal flexible DC transmission network, including steps as follows:

S1, after a line fails, a fault point generating a fault traveling wave, the traveling wave propagating at a speed of light to both ends of the line;

S2, upon sensing a sharp change in voltage by measuring apparatuses at both the ends of the line, it is considered that a DC system has a fault, and a discriminant formula is as follows:

$$|du_{Bus2}/dt| > \Delta U_{set} \quad (3)$$

where, $u_{Bus2}$ is voltage at a point $U_{Bus2}$, and $\Delta U_{set}$ is a threshold value set for detecting a fault;

S3, when the fault is identified, further using a formula (4) to determine a direction of the fault, if a voltage change rate on a line side of a current-limiting reactor is greater than a voltage change rate on a converter side of the current-limiting reactor, the fault is considered as a forward fault, sending a converter active injection control start signal, or if a voltage change rate on a line side of a current-limiting reactor is less than a voltage change rate on a converter side of the current-limiting reactor, active injection control is not being activated;

$$|du_{Bus2}/dt| > |du_{Con2}/dt| \quad (4)$$

where, $u_{Con2}$ is voltage at a point $U_{Con2}$;

S4, when the formulas (3) and (4) are satisfied at the same time, switching a $MMC_2$ converter to a control mode 2, and activating active injection control, a frequency of a generated characteristic signal being 600 Hz and lasting for at least 2 cycles; and S5, extracting a characteristic voltage and a current signal at an injection frequency, and calculating a phase angle difference between the voltage and the current; and constructing a fault identification criterion:

$$\angle \overline{U}_{in} - \angle \overline{I}_{in} = \theta > \Delta_{in} = 0° \quad (5)$$

if a calculated θ is greater than 0, it is considered that an internal fault occurs, or if a calculated θ is less than 0, it is considered that an external fault occurs.

In step S4, the control mode 2 is active injection control.

The three-terminal flexible DC transmission network includes: an $MMC_1$ converter, the $MMC_2$ converter and an $MMC_3$ converter; and in the MMC1 converter and the $MMC_2$ converter are power control stations, and the $MMC_3$ converter is a voltage control station.

Beneficial effects of the present disclosure: 1) Using a half-bridge converter to actively inject a characteristic signal after a fault, without adding additional equipment, fault features may be created and a fault interval can be reliably identified; 2) there is no need to wait for fault isolation before fault identification, which has the advantage of rapidity; 3) compared with full-bridge sub-modules, economic performance of the proposed method is better; and 4) it has selectivity, and the entire system may not be shut down due to failure of a single line.

The present disclosure proposes a method for protecting DC line impedance phase based on protection and control coordination. The method for protecting uses high controllability of a converter after a fault, injects a characteristic signal at a characteristic frequency, and calculates a phase angle of input impedance to determine a fault interval, which effectively improves protection performance. Compared with the traditional protection method based on fault transient characteristics, the proposed method for protecting turns passive to active, and is not affected by nonlinearity of the converter. At the same time, compared with a full-bridge MMC, using a half-bridge MMC does not need to perform fault ride-through first when identifying a fault, which improves protection quickness and at the same time also has better economic benefits.

BRIEF DESCRIPTION OF THE DRAWINGS

The present disclosure has the following accompanying drawings.

DETAILED DESCRIPTION OF EMBODIMENTS

The present disclosure will be further described in detail below with reference to the accompanying drawings.

1. Converter Control Mode

Figure 1:
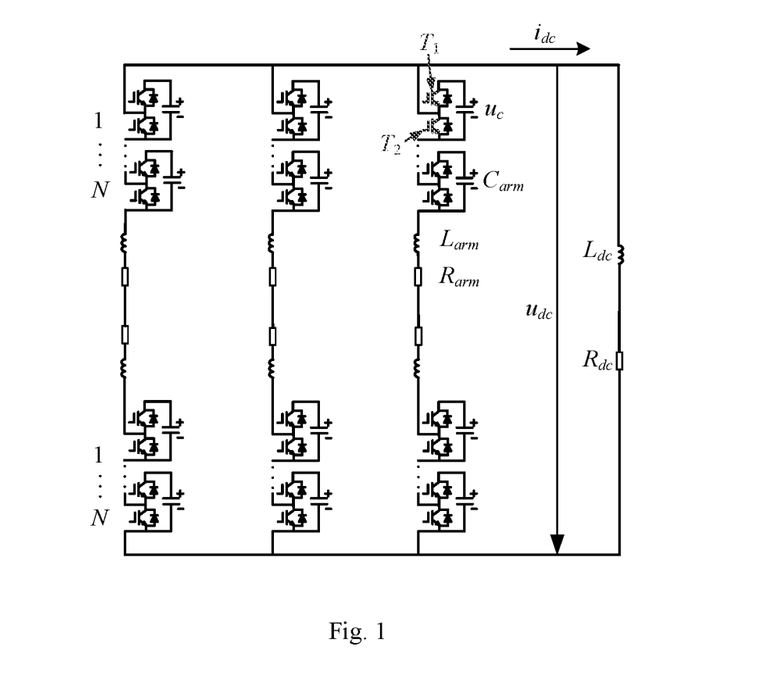
FIG. 1 is a schematic diagram of an internal structure of a converter.

A main topology of MMC is as shown in FIG. 1. The interior of a converter is composed of three bridge arms, where $L_{arm}$ is inductance of upper and lower bridge arms, $R_{arm}$ is bridge arm resistance, $L_{dc}$ is equivalent inductance of a DC side, and $R_{dc}$ is equivalent resistance of the DC side. In steady-state operation before a fault, a sub-module capacitor $C_{arm}$ is turned on or bypassed by turning on or off IGBT elements T1 and T2 in a sub-module. When T1 is turned on, the sub-module capacitor is turned on and is in a state of charging or discharging; when T2 is turned on, the sub-module capacitor is bypassed. Under normal circumstances, a control link is as shown in mode 1 (double closed-loop vector control) in FIG. 2. A sum of the input number of three-phase upper and lower bridge arm sub-modules on the DC side is kept the same to maintain voltage stability, and an AC side is maintained by the number of sub-modules for upper and lower bridge arms turned on allocated by an AC reference voltage generated by double closed-loop control.

Figure 2:
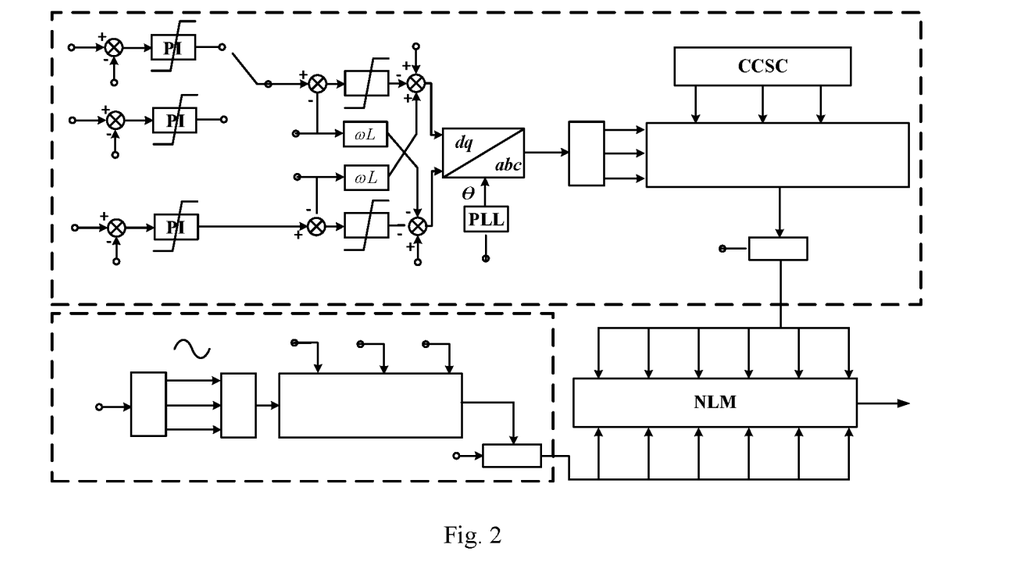
FIG. 2 is a block diagram of converter control.

When a line fails, a fault traveling wave reaches both ends of the line and causes a sharp change in voltage and current. After sensing the fault, the converter immediately switches a control mode to control mode 2 (active injection control). By directly changing a proportion of the number of turns on each bridge arm, a sum of the number of sub-modules of the upper and lower bridge arms may change in a sinusoidal law, and at the same time meet the demand of AC side voltage in the shortest possible time. Finally, the converter may output voltage at a characteristic frequency and responds on the DC side.

2. Active Injection Protection Application Scenario

Figure 3:
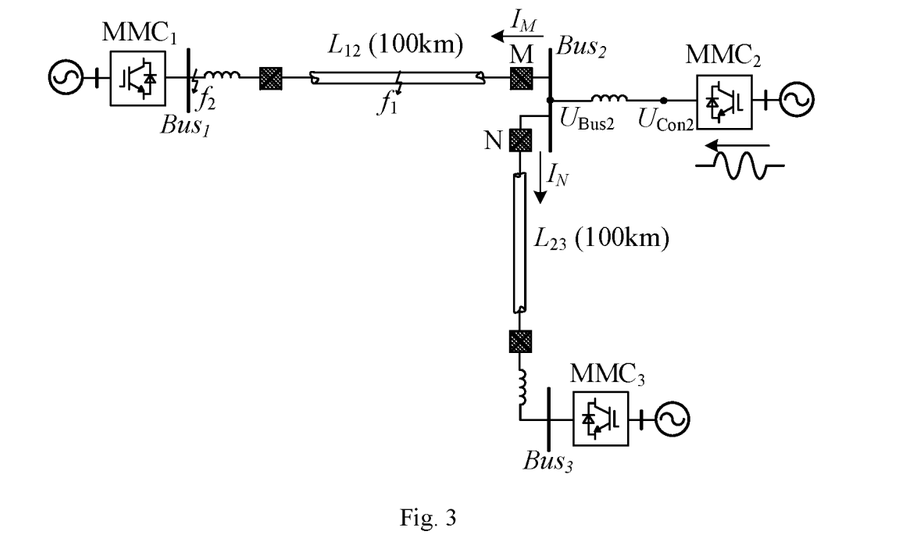
FIG. 3 is a topology of a three-terminal flexible DC transmission network.

In the present disclosure, an example application scenario is a three-terminal flexible DC transmission network, as shown in FIG. 3. In this topology, the first two of $MMC_1$, $MMC_2$ and $MMC_3$ are power control stations, and the latter is a voltage control station. A length of a line $L_{12}$ and a line $L_{23}$ is 100 km. When the DC system fails, the converter station $MMC_2$ will be switched to an active injection control mode, and outlet voltage will be sinusoidal.

1) Amplitude of Injected Signal

In a normal modulation mode, a sum of the number of sub-modules of the upper and lower bridge arms of each phase of the MMC remains unchanged, and is half of the total, in this regard, an input ratio is defined as D=0.5. After the converter is switched to mode 2 of active injection control, the input ratio then changes sinusoidally, and a corresponding input ratio change interval is [0, 0.5]. Since rated voltage on the DC side is 500 KV, an amplitude of output sinusoidal voltage of the converter after an actual fault is 250 kV.

2) Frequency of Injected Signal

Figure 4:
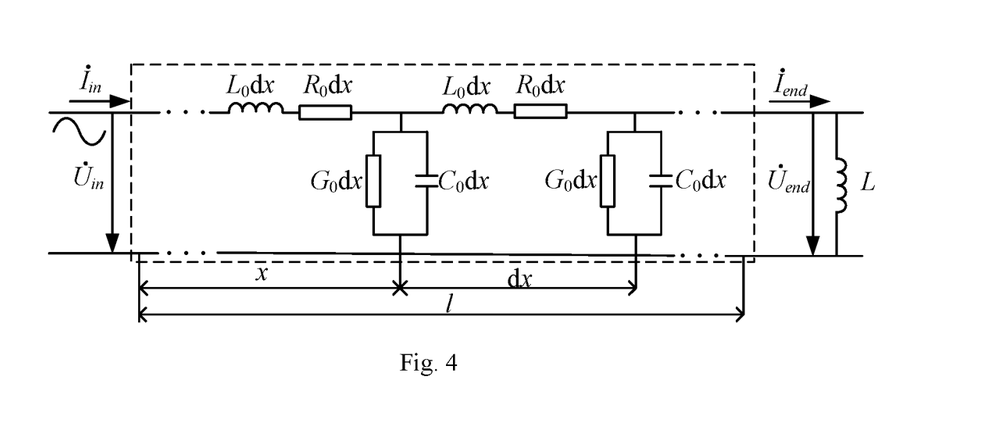
FIG. 4 is a distribution parameter model of a transmission line.

According to the line length of the flexible DC grid in FIG. 3, the frequency of a signal generated by the converter may be selected. A distribution parameter model of the line is as shown in FIG. 4, where $L_0$, $R_0$, $G_0$, and $C_0$ are inductance, resistance, conductance, and capacitance per unit length of the line, respectively, L is a current-limiting reactor at an end of the line, $U_{in}$ and $I_{in}$ are characteristic voltage and current at an injection frequency at an input terminal, and $U_{end}$ and $I_{end}$ are voltage and current at the injection frequency at the end of the line.

When an external fault occurs on the line, large inductance at the end of the line is still connected to the line. In this regard, an expression of an input impedance amplitude $Z_{in}$ at the injection frequency is as follows:

$$Z_{in} = \frac{\bar{U}_{in}}{\bar{I}_{in}} = j\frac{\omega L + Z_c\tan(\omega l\sqrt{L_0 C_0})}{1 - \omega L\tan(\omega l\sqrt{L_0 C_0})} \quad (1)$$

where, $\bar{U}_{in}$ is a characteristic voltage vector at the injection frequency at the input terminal, $\bar{I}_{in}$ is a characteristic current vector at the injection frequency at the input terminal, $\omega$ is an angular frequency at the injection frequency at the input terminal, $Z_c$ is wave impedance, and l is a length of the transmission line.

Figure 5:
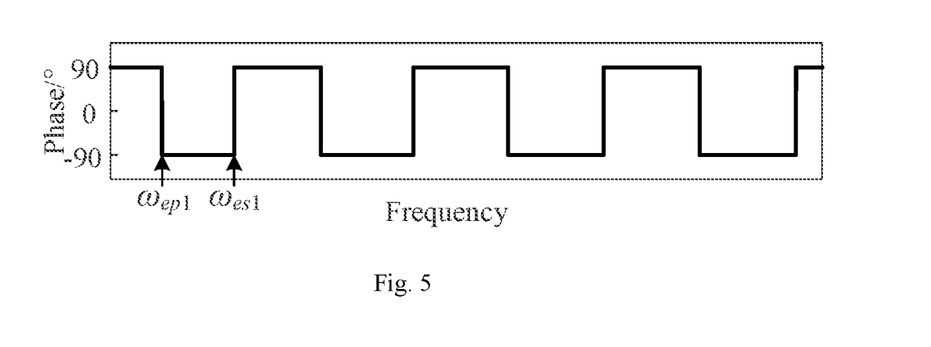
FIG. 5 is a characteristic diagram of an input impedance phase angle under an external fault.

After bringing in the line parameters, phase-frequency characteristics of the input impedance may be obtained, as shown in FIG. 5. As the frequency increases, the phase alternates between −90 and 90 degrees. Here, $\omega_{epl}$ is a first parallel resonance point, and $\omega_{esl}$ is a first series resonance point.

When the line fails, the large inductance at the end of the line is short-circuited, and in this regard, an expression of the input impedance amplitude $Z_{in}$ at the injection frequency is as follows:

$$Z_{in} = \frac{\bar{U}_{in}}{\bar{I}_{in}} = jZ_c\tan(\omega l\sqrt{L_0 C_0}) \quad (2)$$

Figure 6:
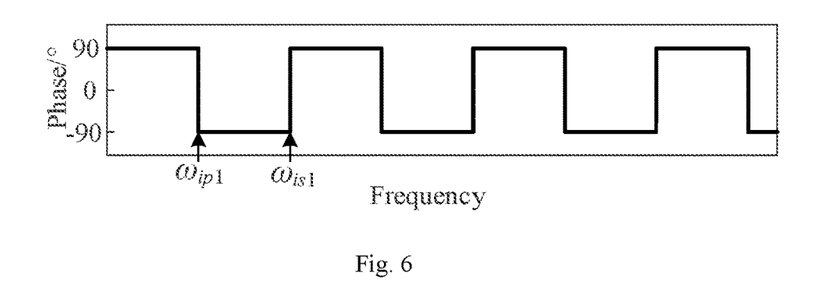
FIG. 6 is a characteristic diagram of an input impedance phase angle under an internal fault.

After bringing in the line parameters, the phase-frequency characteristics of the input impedance may be obtained, as shown in FIG. 6. As the frequency increases, the phase alternates between −90 and 90 degrees. Here, $\omega_{ipl}$ is the first parallel resonance point, and $\omega_{isl}$ is the first series resonance point.

By comparing an impedance phase angle difference between the internal fault and the external fault, it may be seen that in the interval [$\omega_{epl}$, $\omega_{esl}$], an external fault phase angle is 90 degrees, and the external fault is −90 degrees. Therefore, bringing in this line parameter, an injection frequency interval may be obtained as [459 Hz, 683 Hz]. Finally, the injection frequency is set as 600 Hz.

3. Implementation Principle of Active Injection Protection

Figure 7:
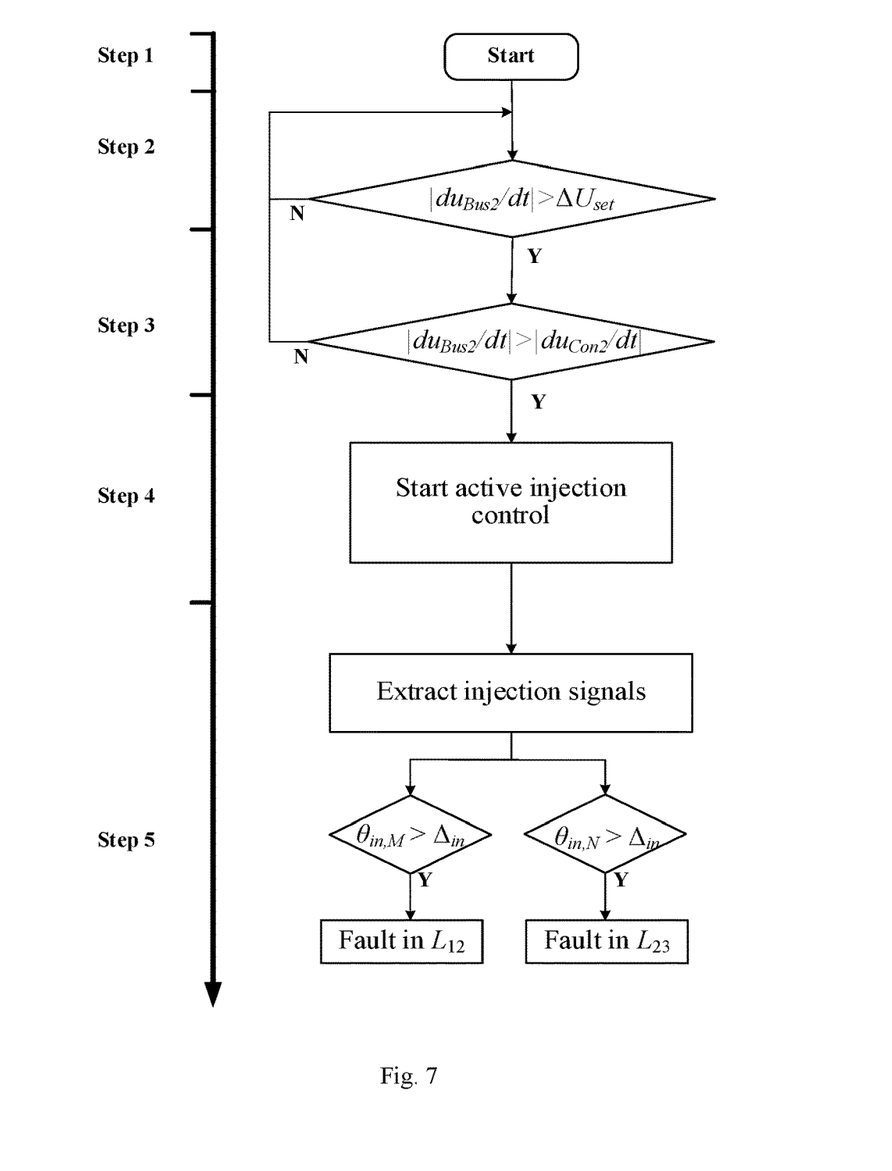
FIG. 7 is a block diagram of converter control.

Taking the flexible DC system in FIG. 3 as an example, it is assumed that a metallic ground fault occurs, to illustrate an implementation process and working principle of active injection protection. A protection flow of the present disclosure is as shown in FIG. 7:

1) Phase 1 after a line fails, a fault point generating a fault traveling wave, the traveling wave propagating at a speed of light to both ends of the line.

2) Phase 2 upon sensing a sharp change in voltage by measuring apparatuses at both the ends of the line, it is considered that a DC system has a fault, and a discriminant formula is as follows:

$$|du_{Bus2}/dt| > \Delta U_{set} \quad (3)$$

where, $u_{Bus2}$ is voltage at a point $U_{Bus2}$, and $\Delta U_{set}$ is a set threshold value.

3) Phase 3 when the fault is identified, further using a formula (4) to determine a direction of the fault, if a voltage change rate on a line side of a current-limiting reactor is greater than a voltage change rate on a converter side of the current-limiting reactor, the fault is considered as a forward fault, sending a converter active injection control start signal, or if a voltage change rate on a line side of a current-limiting reactor is less than a voltage change rate on a converter side of the current-limiting reactor, active injection control is not being activated;

$$|du_{Bus2}/dt| > |du_{Con2}/dt| \quad (4)$$

where, $u_{Con2}$ is voltage at a point $U_{Con2}$.

4) Phase 4 when the formulas (3) and (4) are satisfied at the same time, switching a MMC$_2$ converter to a control mode 2, and activating active injection control, a frequency of a generated characteristic signal being 600 Hz and lasting for at least 2 cycles.

5) Phase 5 extracting a characteristic voltage and a current signal at an injection frequency, and calculating a phase angle difference between the voltage and the current; and constructing a fault identification criterion:

$$\angle \overline{U}_{in} - \angle \overline{I}_{in} = \theta > \Delta_{in} = 0° \quad (5)$$

if a calculated angle θ is greater than 0, it is considered that an internal fault occurs, or if a calculated angle θ is less than 0, it is considered that an external fault occurs.

4. Fault Case Simulation Experiment

1) Internal Fault

Figure 8:
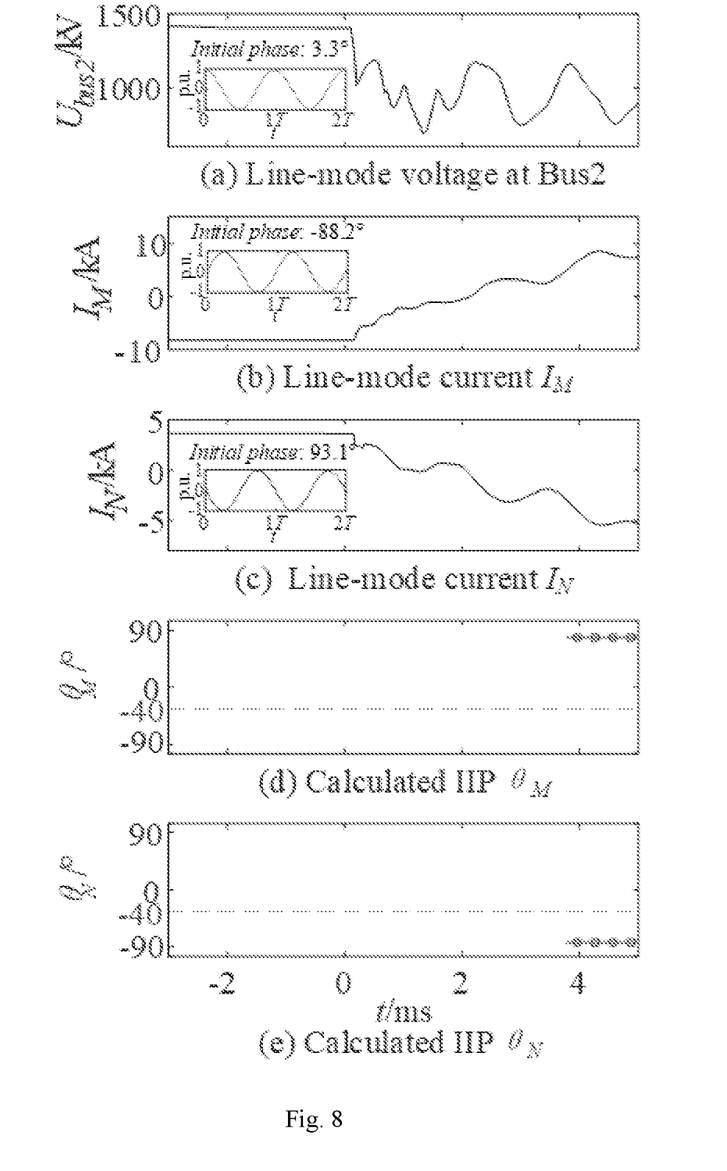
FIG. 8 is a characteristic diagram of an internal fault.

It is set that a metallic ground fault f$_1$ occurs at 1 s, and its fault features are as shown in FIG. 8. When the traveling wave reaches a line port, a measuring element senses a rapid drop in voltage, and both of the formulas (3) and (4) are satisfied. The MMC$_2$ converter switches the control mode to mode 2, and actively controls the switching of bridge arm sub-modules to generate a sinusoidal characteristic signal designed in advance. By measuring voltage at an extraction outlet and a phase angle of the current at the injection frequency, it can be known that an initial phase angle of the voltage $U_{bus2}$ is 3.3°, an initial phase angle of the current $I_M$ is −88.2°, and an initial phase angle of the current $I_N$ is 93.1°, so it can be calculated that an initial phase angle of the input impedance of the line $L_{12}$ is 91.5°, and an initial phase angle of the input impedance of the line $L_{23}$ is −89.8°. According to the criterion (5), it can be obtained that the line $L_{12}$ has an internal fault, and there is no internal fault on the line $L_{23}$, which may effectively identify the fault interval.

2) External Fault

Figure 9:
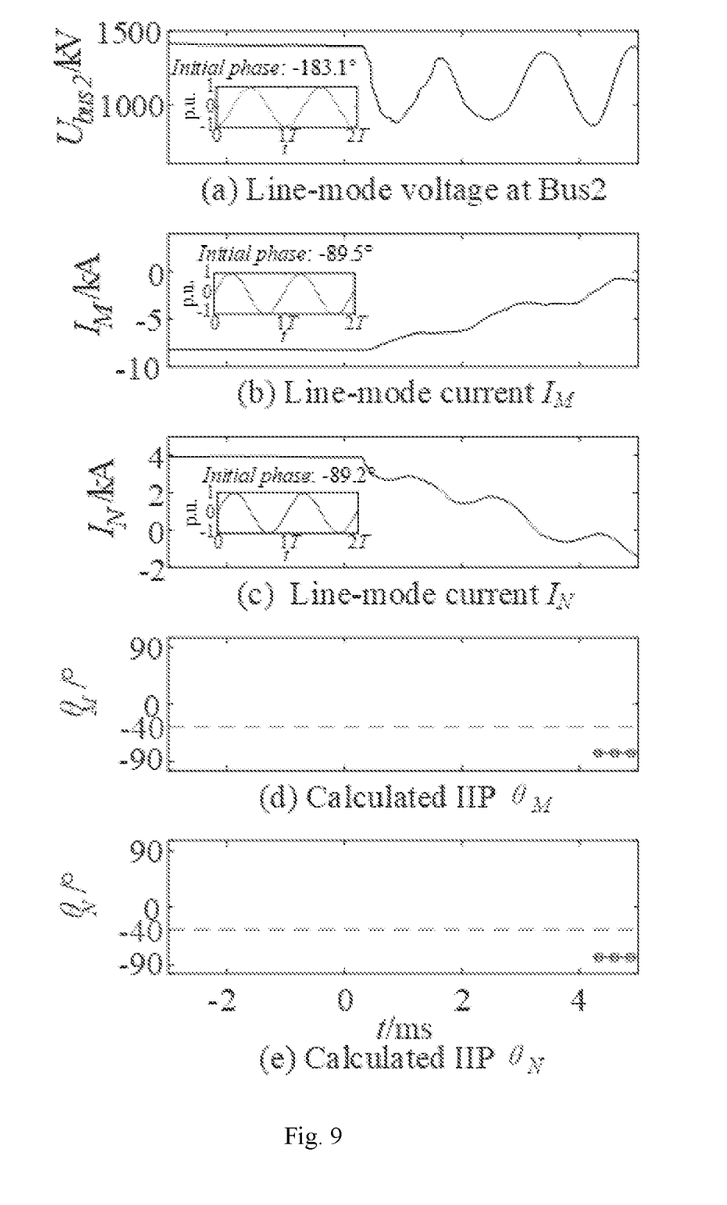
FIG. 9 is a characteristic diagram of an external fault.

It is set that a metallic ground fault f$_2$ occurs at 1 s, and its fault features are as shown in FIG. 9. When the traveling wave reaches the line port, the measuring element also senses a rapid drop in voltage, and both of the formulas (3) and (4) are satisfied. The MMC$_2$ converter switches the control mode to mode 2, and actively controls the switching of bridge arm sub-modules to generate a sinusoidal characteristic signal designed in advance. By measuring the voltage at the extraction outlet and the phase angle of the current at the injection frequency, it can be known that the initial phase angle of the voltage $U_{bus2}$ is −1.1°, the initial phase angle of the current $I_M$ is 89.5°, and the initial phase angle of the current $I_N$ is 89.2°, so it can be calculated that the initial phase angle of the input impedance of the line $L_{12}$ is −90.6°, and the initial phase angle of the input impedance of the line $L_{23}$ is −90.3°. According to the criterion (5), it can be obtained that there is no fault inside the line $L_{12}$ and the line $L_{23}$, and it may be determined that an external fault occurs.

The above embodiments are only used to illustrate the present disclosure, but not to limit the present disclosure. Those of ordinary skill in the relevant technical field may also make various changes and modifications without departing from the spirit and scope of the present disclosure. Therefore, all equivalent technical solutions also belong to the protection scope of the present disclosure.

REFERENCE TO THE DRAWINGS

FIG. 2
Double closed-loop vector control
Circulation suppression
Mode 1
Mode 2
Active injection control
Nearest level approximation modulation
Trigger control
FIG. 5
Frequency
Phase angle
FIG. 6
Frequency
Phase angle
FIG. 7
Start
Phase 1
Phase 2
Phase 3
Phase 4
Phase 5
Converter activating injection control
Fixed delay
Extracting an electrical quantity at the injection frequency
$L_{12}$ fault
$L_{23}$ fault
FIG. 8
Initial angle
Measuring voltage at Bus2
Measuring current
Calculating impedance phase difference
FIG. 9
Initial angle
Measuring voltage at Bus2
Measuring current
Calculating impedance phase difference Contents not described in detail in this specification belong to the prior art known to those skilled in the art.

What is claimed is:

1. A method for protecting DC line impedance phase based on protection and control coordination, an application scenario of the method for protecting being a three-terminal flexible DC transmission network, comprising steps as follows:

S1, after a line fails, a fault point generating a fault traveling wave, the traveling wave propagating at a speed of light to both ends of the line;

S2, upon sensing a sharp change in voltage by measuring apparatuses at both the ends of the line, it is considered that a DC system has a fault, and a discriminant formula is as follows:

$$|du_{Bus2}/dt| > \Delta U_{set} \quad (3)$$

wherein, $u_{Bus2}$ is voltage at a point $U_{Bus2}$, and $\Delta U_{set}$ is a threshold value set for detecting a fault;

S3, when the fault is identified, further using a formula (4) to determine a direction of the fault, if a voltage change rate on a line side of a current-limiting reactor is greater than a voltage change rate on a converter side of the current-limiting reactor, the fault is considered as a forward fault, sending a converter active injection control start signal, or if a voltage change rate on a line side of a current-limiting reactor is less than a voltage change rate on a converter side of the current-limiting reactor, active injection control is not being activated;

$$|du_{Bus2}/dt| > |du_{Con2}/dt| \quad (4)$$

wherein, $u_{Con2}$ is voltage at a point $U_{Con2}$;

S4, when the formulas (3) and (4) are satisfied at the same time, switching a MMC$_2$ converter to active injection control, and activating active injection control, a frequency of a generated characteristic signal being 600 Hz and lasting for at least 2 cycles; and S5, extracting a characteristic voltage and a current signal at an injection frequency, and calculating a phase angle difference between the voltage and the current; and constructing a fault identification criterion:

$$\angle \overline{U}_{in} - \angle \overline{I}_{in} = \theta > \Delta_{in} = 0° \quad (5)$$

wherein, $U_{in}$ is a characteristic voltage vector at the injection frequency at an input terminal, and in is a characteristic current vector at the injection frequency at the input terminal; and if a calculated 0 is greater than 0, it is considered that an internal fault occurs, or if a calculated 0 is less than 0, it is considered that an external fault occurs.

2. The method for protecting DC line impedance phase based on protection and control coordination according to claim 1, wherein the three-terminal flexible DC transmission network comprises: an MMC$_1$ converter, the MMC$_2$ converter and an MMC$_3$ converter; and the MMC$_1$ converter and the MMC$_2$ converter are power control stations, and the MMC$_3$ converter is a voltage control station.

* * * * *